(12) United States Patent
Nakano et al.

(10) Patent No.: US 6,903,438 B2
(45) Date of Patent: Jun. 7, 2005

(54) LOW-IMPEDANCE DECOUPLING DEVICE

(75) Inventors: Takashi Nakano, Tokyo (JP); Hirokazu Tohya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/408,222

(22) Filed: Apr. 8, 2003

(65) Prior Publication Data

US 2003/0189247 A1 Oct. 9, 2003

(30) Foreign Application Priority Data

Apr. 8, 2002 (JP) ........................................ 2002-105186

(51) Int. Cl.[7] .............................................. H01L 29/00
(52) U.S. Cl. ........................ 257/532; 257/534; 257/531
(58) Field of Search ................................. 257/532, 534, 257/531; 438/957, 255, 398, 665, 964

(56) References Cited

U.S. PATENT DOCUMENTS 6,524,905 B2 * 2/2003 Yamamichi et al. ........ 438/240
6,624,501 B2 * 9/2003 Shioga et al. ............... 257/534
2004/0018693 A1 * 1/2004 Shioga et al. ............... 438/396

FOREIGN PATENT DOCUMENTS

JP          10-270643 A       10/1998

* cited by examiner

*Primary Examiner*—Eddie Lee
*Assistant Examiner*—Douglas W. Owens
(74) *Attorney, Agent, or Firm*—Sughrue Mion, PLLC

(57) ABSTRACT

A decoupling device for decoupling a high-frequency noise wave in a digital circuit is formed as a line device including a portion of a semiconductor substrate, an insulator film formed thereon as a gate oxide film, and an interconnect line formed thereon as a gate electrode. The line capacitance between the interconnect line and the semiconductor substrate is 100 pF or above, whereby the decoupling device effectively decouples the electromagnetic noise wave generated by a switching device in a frequency range between 10 and 1000 GHz.

31 Claims, 14 Drawing Sheets

LOW-IMPEDANCE DECOUPLING DEVICE

BACKGROUND OF THE INVENTION (a) Field of the Invention

The present invention relates to a low-impedance decoupling device and, more particularly, to a low-impedance decoupling device implemented as a line device and suitably used for decoupling an electromagnetic noise wave in a high-frequency LSI.

(b) Description of the Related Art

Electromagnetic interference is caused by an electromagnetic wave induced by a switching operation of a semiconductor element used as a switching device in a digital circuit. The electromagnetic wave includes high-harmonic wave components of a clock frequency, or fundamental wave, which cause high-frequency noise in the semiconductor circuit. Some of the high-frequency electromagnetic wave components generated by the switching device in the LSI are coupled with the signal lines etc. in the LSI, package or printed circuit board (PCB) by induction coupling while the electromagnetic components transfer along a power-source distribution line in the LSI. The induction coupling of a high-frequency electromagnetic wave with the signal line causes emission of an electromagnetic wave from a signal cable or apparatus and thus leakage thereof toward outside the LSI.

If a surge impedance, i.e., an impedance of the power-source distribution line in the high-frequency range as viewed from the switching device in the LSI is higher, the high-frequency electromagnetic wave generated by the switching device in the LSI interferes with the signal line to generate a distortion in the signal voltage thereon. For suppressing such an interference, it is effective to insert a power-source decoupling circuit in the power-source distribution line.

The conventional decoupling devices for semiconductor circuits, as in the case of the "Semiconductor die having an on-die decoupling capacitance" described in Patent Publication JP-A-10-270643, have smaller dimensions compared to the wavelength corresponding to the operational frequency of the semiconductor circuit. Thus, it is general to add a decoupling device including a capacitor, construed as having a lumped-parameter capacitance, to the power-source distribution line as a low-impedance device.

It is to be noted that the insulator film underlying the power-source distribution line in the LSI is generally implemented by a field oxide film (element-isolation oxide film), and has a thickness of around 500 to 1000 nm (5000 to 10000 angstroms).

When a capacitor 21 is used as the decoupling device for a power source distribution line 20 by connecting the capacitor 21 thereto, as shown in FIG. 13A, a serial inductance of the connection line 22 must be considered. That is, the inductance of the connection line 22 degrades the decoupling performance of the capacitor 21.

It may be considered to separate the capacitor into a plurality of small-capacitance capacitors and dispose the same separately in the LSI, package and PCB. This effectively reduces the inductance of the connection line 22 for the capacitor 21 to suppress the degradation of the decoupling performance of the capacitor 21.

However, the inductance of the connection line 22 cannot be neglected even if the capacitor 21 is separated into a large number of small-capacitance capacitors. For example, if such a capacitor 21 is located adjacent to the distribution line 20 without a gap therebetween, as shown in FIG. 13B, the mean distance between the distribution line 20 and all the portions of the capacitor 21 is half the width of the capacitor 21, thereby degrading the decoupling performance of the capacitor 21 corresponding to the distance of the half width.

In addition, since the capacitor has a dominant inductance component at a frequency above the series resonance frequency of the capacitance and the inductance of the capacitor 21, a higher frequency degrades the impedance characteristic of the capacitor 21 accordingly.

In short, since the capacitor itself assumes an inductance property in a frequency range above several hundreds of megahertz (MHz) even if the capacitor is separated into a large number of small-capacitance capacitors and provided separately, the capacitor does not afford a capacitive decoupling device in the high-frequency range.

In the circumstances wherein the current digital circuit has a higher operational frequency as high as gigahertz order, the capacitor should have a lower impedance required of the decoupling circuit in the frequency range above the several hundreds of megahertz.

As described above, the capacitor generally used as the conventional decoupling device assumes an inductance property in the frequency range above the several hundreds of MHz. Thus, it is desired to provide a low-impedance device or a low-impedance structure for achieving a decoupling circuit effectively performing the decoupling function in a digital circuit having a clock frequency of a gigahertz order.

SUMMARY OF THE INVENTION

In view of the above, it is an object of the present invention to provide a low-impedance decoupling device used in a high-frequency range in which the conventional decoupling circuit having a capacitor as the decoupling device scarcely performs the effective decoupling function.

It is another object of the present invention to provide a semiconductor circuit including such a low-impedance decoupling device for effectively decoupling electromagnetic noise wave from the power-source distribution line.

The present invention provides a decoupling device formed in a semiconductor circuit, including: a semiconductor substrate; an insulator film formed on the semiconductor substrate; and an interconnect line formed on the insulator film, wherein: a line capacitance between the interconnect line and the semiconductor substrate is set at a value such that the decoupling device effectively decouples or blocks an electromagnetic noise wave generated in the semiconductor circuit.

The present invention also provides a decoupling device formed in a semiconductor circuit, including: a first insulator film formed on a semiconductor substrate; a conductor layer formed on the insulator film; a second insulator film formed on the conductor layer; and an interconnect line formed on the second insulator film, wherein: at least one of interfaces between the conductor layer and the second insulator film and between the second insulator film and the interconnect line has a concave and convex surface; and a line capacitance between the interconnect line and the conductor layer is set at a value such that the interconnect line effectively decouples an electromagnetic noise wave generated in the semiconductor circuit.

The present invention also provides a semiconductor circuit including: a semiconductor substrate; a high-frequency source overlying the semiconductor substrate; a power-source distribution line overlying the semiconductor substrate for supplying power to the high-frequency source; and a line device including a portion of the semiconductor substrate, an insulator film formed on the portion, and an interconnect line formed on the insulator film, the interconnect line being connected in series with the power-source distribution line to thereby form a part thereof, wherein a line capacitance between the interconnect line and the semiconductor substrate is set at a value such that the interconnect line effectively decouples an electromagnetic wave generated by the high-frequency source.

The present invention also provides a semiconductor circuit including: a semiconductor substrate; a high-frequency source overlying the semiconductor substrate; a power-source distribution line overlying the semiconductor substrate for supplying power to the high-frequency source; and a line device including a conductor layer overlying the semiconductor substrate, an insulator film formed on the conductor layer, and an interconnect line formed on the insulator film, the interconnect line being connected in series with the power-source distribution line to thereby form a part thereof, wherein a line capacitance between the interconnect line and the conductor layer is set at a value such that the interconnect line effectively decouples an electromagnetic wave generated by the high-frequency source.

In accordance with the decoupling device and the semiconductor circuit of the present invention, the decoupling device implemented as a line device has a lower impedance compared to the decoupling device implemented by a capacitor in a higher-frequency range, and thus has a higher decoupling performance therein.

The above and other objects, features and advantages of the present invention will be more apparent from the following description, referring to the accompanying drawings.

BRIEF DESCRIPTION OF THE DRAWINGS

FIGS. 3A, 3B and 3C are sectional view, top plan view and perspective view, respectively, of a line device in a semiconductor circuit according to a second embodiment of the present invention, wherein FIG. 3A is taken along line A—A' in FIG. 3B.

FIGS. 5A, 5B and 5C are sectional view, top plan view and perspective view, respectively, of another example of a line device in a semiconductor circuit according to the second embodiment, wherein FIG. 5A is taken along line B—B' in FIG. 5B.

FIGS. 6A, 6B and 6C are sectional view, top plan view and perspective view, respectively, of a line device in a semiconductor circuit according to a third embodiment of the present invention, wherein FIG. 6A is taken along line C—C in FIG. 6B.

PREFERRED EMBODIMENTS OF THE INVENTION

Before describing embodiments of the present invention, the principle of the decoupling device, or line device of the present invention will be detailed for a better understanding of the present invention.

Figure 11:
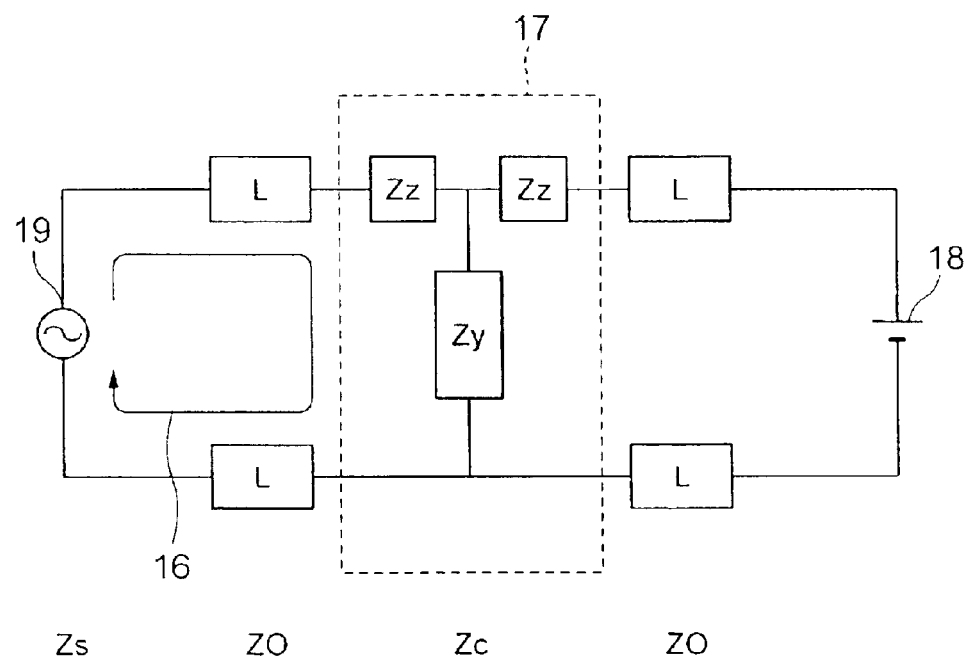
FIG. 11 is a circuit diagram of a power-source distribution circuit including the line device of an example of the present invention.

Referring to FIG. 11, there is shown the circuit diagram of a part of a semiconductor circuit including a line device according to a first embodiment of the present invention. The power source circuit includes a DC power source 18, the line device 17 of the embodiment, and a switching device 19 acting as a high-frequency noise source, which are connected through the power-source distribution lines (distribution lines, or power source lines) having inductance components (L).

The switching device 19 is operated by the DC power supplied from the DC power source 18 to perform a switching operation, which generates a high-frequency current flowing along the power source lines. The switching device 19 is implemented by a MOSFET, for example.

The line device 17 functions as a decoupling device and is located in close proximity to the switching device 19.

It is assumed that the characteristic impedance Zc of the line device 17 includes a serial impedance Zz which is serial to the DC power source 18 and a parallel impedance Zy which is parallel thereto. It is also assumed that the surge impedance Zs within the switching device 19 is unknown whereas the characteristic impedance Z0 of the power source lines assumes several tens of ohms in the frequency range for the desired decoupling performance.

In the above configuration of the semiconductor circuit, the high-frequency power source current 16 generated by the switching device 19 is bypassed by the line device 17 and not substantially transferred to the DC power source 18 so long as the characteristic impedance Zc of the line device 17 is small enough. In other words, by achieving a small value for the characteristic impedance Zc of the line device 17, an improved decoupling performance can be obtained in the semiconductor circuit.

Figure 12:
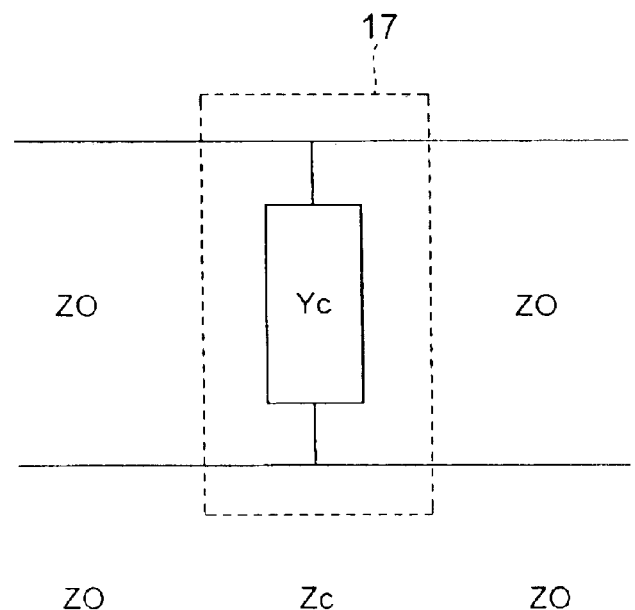
FIG. 12 is a simplified circuit diagram of FIG. 11.

Referring to FIG. 12, a simplified circuit diagram is obtained from FIG. 11 by replacing the constituent elements of the line device 17 by an admittance Yc and neglecting the characteristic impedance Zz. In this configuration, the reflectance coefficient $\Gamma$ and the transmission coefficient T are represented by elements S11 and S21; respectively, of a scattering matrix [S], as follows:

$$[S] = \frac{1}{Yc'+2} \begin{bmatrix} -Yc' & 2 \\ 2 & -Yc' \end{bmatrix}; \quad (1)$$

$$\Gamma = S11 = \frac{-Yc'}{Yc'+2} = \frac{-1}{2 \cdot (Zc/Z0)+1}; \quad (2)$$

and $$T = S21 = \frac{2}{Yc'+2} = \frac{2 \cdot (Zc/Z0)}{2 \cdot (Zc/Z0)+1}, \quad (3)$$

wherein $Yc'=Yc/Y0$, $Y0=1/Z0$ and $Yc=1/Zc$.

It is assumed here that the characteristic impedance Z0 of the power source line is higher than the characteristic impedance Zc of the line device 17 to a considerable degree, i.e., $Zc/Z0 \approx 0$ satisfies. In this case, the reflectance coefficient Γ assumes "−1" whereas the transmission coefficient T assumes "0". Thus, the high-frequency current 16 does not transfer to the DC power source 18, whereby electromagnetic emission can be suppressed by the power source decoupling function.

In other words, if the transmission coefficient T of the high-frequency current transferring from the switching device 19 to the DC power source 18 can be construed substantially at zero in the case where the transmission coefficient T is expressed by the above formula (3), the line device 17 exhibits an excellent performance as a decoupling device.

In addition, by reducing the value for the surge impedance of the line device 17 as viewed from the switching device 19 down to an extremely small value, distortion of the signal wave generated by the switching device 19 can be suppressed.

As described before, if an ordinary capacitor is used as a decoupling device, the decoupling performance is degraded due to the influence by the inductance of the connection line provided between the decoupling capacitor and the interconnect line. In addition, the frequency characteristic of the capacitor itself degrades the decoupling performance thereof at a higher-frequency range.

Figure 13A:
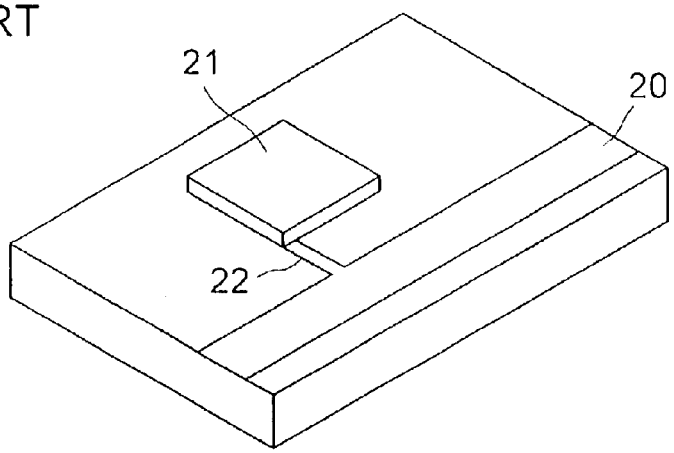
FIGS. 13A, 13B and 13C are perspective views of conventional decoupling devices and the decoupling device of the present invention
Figure 13B:
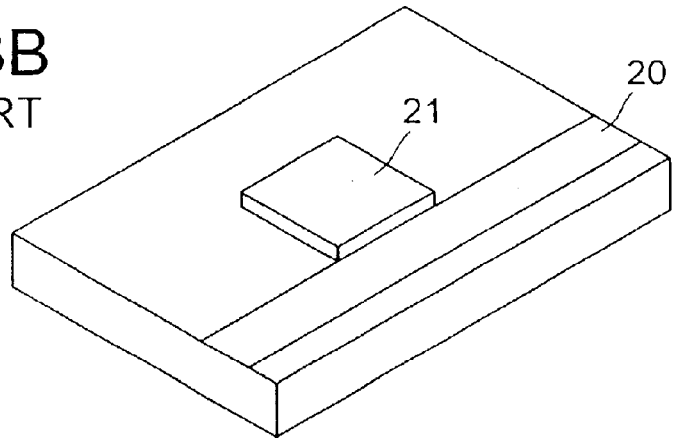
Figure 13C:
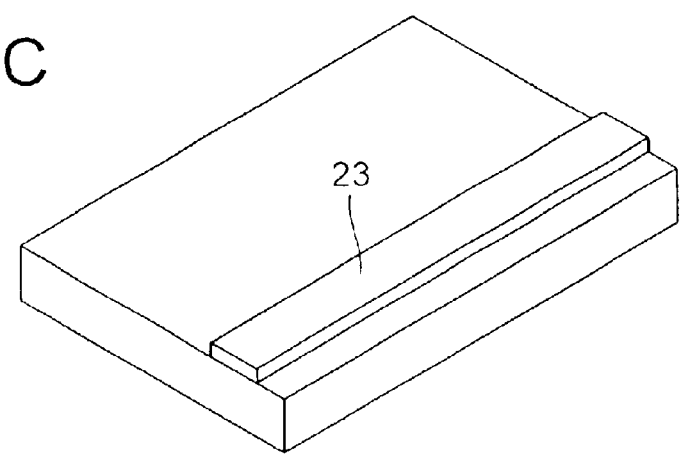

In view of the above, the present invention uses the line device such as shown in FIG. 13C as the decoupling device, the line device being configured as an interconnect line 23. This interconnect line 23 implementing the line device 17 shown in FIG. 11 or 12 has an improved decoupling performance. More specifically, the configuration of the interconnect line 23 renders the line length between the capacitor and the distribution line substantially zero to obviate the influence by the inductance of the connection line. In addition, since the impedance of the interconnect line is calculated from $\sqrt{L/C}$, the impedance has a fixed value defined by the capacitive component and the inductance component of the interconnect line without depending on the frequency. Thus, the decoupling performance of the line device of the present invention is in principle not degraded in the high frequency range.

Figure 14:
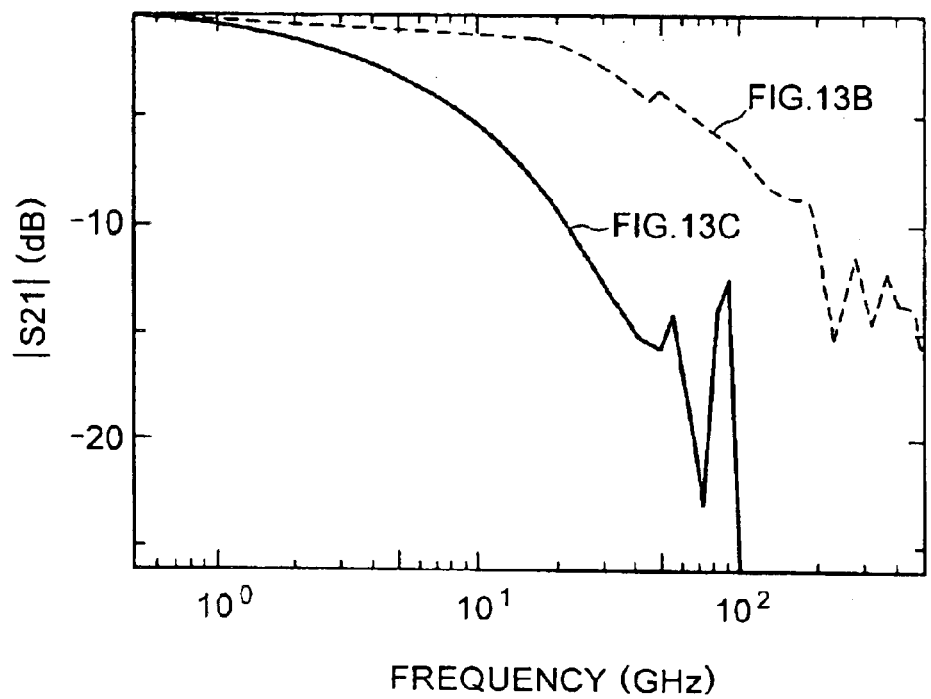
FIG. 14 is a graph showing the relationship between the transmission factor and the noise frequency.

Referring to FIG. 14, there is shown the frequency characteristic of element S21 (refer to formula (3)) of the matrix [S], which expresses the transmission coefficient T of each of the decoupling devices shown in FIGS. 13B and 13C. In other words, FIG. 14 shows the relationships between the transmission coefficients T of the decoupling devices shown in FIGS. 13B and 13C and the frequency. The dotted line shows the transmission coefficient T of the decoupling device of FIG. 13B, whereas the solid line shows the transmission coefficient T of the decoupling device of FIG. 13C. It is to be noted that the transmission coefficient is plotted on ordinate in decibel, and the noise frequency is plotted on the abscissa in gigahertz.

In the decoupling device shown in FIG. 13B, it is assumed, for example, that the distribution line 20 has a line length of 2 mm and a line width of 50 μm, whereas the silicon oxide ($SiO_2$) film underlying the distribution line 20 has a thickness of 500 nm (5000 angstroms) and a line capacitance of 2 pF. The decoupling capacitor 21 itself has a capacitance of 8 pF, whereby the decoupling device has an overall capacitance of 10 pF. On the other hand, in the decoupling device shown in FIG. 13C, the interconnect line 23 has a line length of 2 mm and a line width of 50 μm, the silicon oxide film underlying the interconnect line 23 has a thickness of 100 nm (1000 angstroms) and a line capacitance or overall capacitance of 10 pF.

Comparing the transmission coefficient of the decoupling device of FIG. 13C against the transmission coefficient of the decoupling device of FIG. 13B in FIG. 14, it will be understood that the decoupling device of FIG. 13C is superior in the decoupling performance due to a lower transmission coefficient thereof, i.e., a higher cut-off rate. In particular, the difference in the decoupling performance is more prominent in the higher-frequency range in FIG. 14, whereby the decoupling device of the present invention exhibits an excellent decoupling performance at the higher-frequency range.

In the present invention, the decoupling device is implemented by a line device including a distribution line or interconnect line, which has desired values for the inductance (L), capacitance (C) and resistance (R) thereof for achieving the decoupling performance in the distribution line itself.

The decoupling performance achieved in the interconnect line (or distribution line) itself is superior to the decoupling performance provided by the conventional decoupling device having a capacitor which has a degraded decoupling performance in the higher-frequency range. The decoupling performance achieved by the present invention can reduce the peak value of the voltage fluctuation of the DC power source caused by a high-frequency source down to a specified percentage or lower, e.g., 5% or lower, preferably 3% or lower, and more preferably 1% or lower.

It is to be noted that although the desired decoupling performance can be achieved by selecting parameters including L, C and R, it is preferable to select the value for C because a higher value for L or R necessitates an increase of the power source voltage during switching operations of the logic circuit.

For achieving a desired decoupling performance by selecting a value for the capacitance C of the line device including the distributed line, the distributed line should have a higher capacitance compared to the conventional distributed line in order to obtain an excellent decoupling performance in the higher-frequency range between 10 GHz and 100 GHz.

In the line device of the present invention, the higher capacitance can be achieved by:

(1) reducing the thickness of the insulator film in the line device, i.e., underlying the interconnect line;
(2) using an insulator film having a smaller thickness, such as a gate oxide film used in the semiconductor device, for achieving the reduction of the thickness of the insulator film in the line device;
(3) adjusting the resistance of the interconnect line by increasing the thickness of the gate electrode layer or forming a bypass line for the gate electrode layer and increasing the line capacitance in the case of using the gate oxide film;

(4) forming the insulator film by using a high-permittivity material in association with a selected thickness of the insulator film; and (5) forming a concave and convex surface for the interconnect line or forming a concave and convex interconnect line to increase the line capacitance without increasing the area occupied by the interconnection line and/or using an extremely thin insulator film.

It is to be noted that items (4) and (5) may be accompanied by other items. The occupied area of the interconnect line may be increased to increase the capacitance thereof so long as the increased occupied area does not hinder the high-density integration of the semiconductor circuit. However, it is advantageous to employ any of above items in order for achieving an increase of the capacitance without increasing the occupied area in which the line device is formed on the semiconductor substrate.

Figure 15:
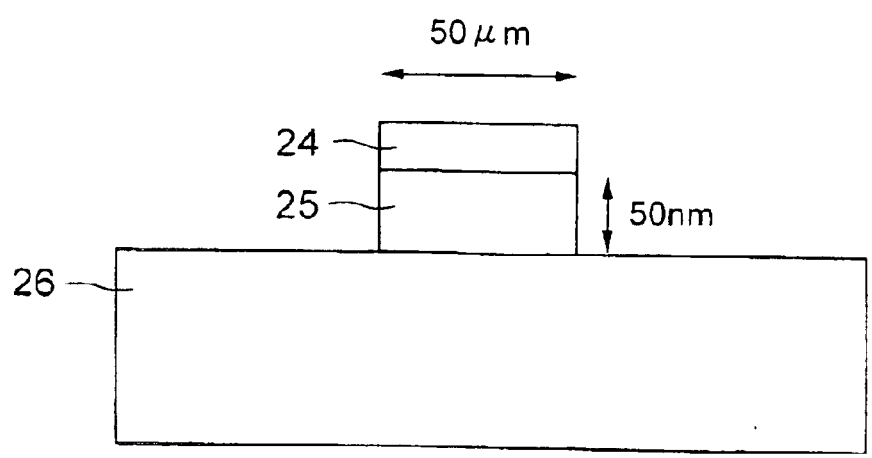
FIG. 15 is a sectional view of a conventional interconnect line.

Referring to FIG. 15, there is shown a conventional interconnect structure wherein an aluminum (Al) interconnect line 24 is formed on a silicon oxide film 25, which is formed on a silicon substrate 26 heavily doped with impurities. Assuming that the interconnect line 24 has a length of 2 mm and a width of 50 $\mu$m and that the oxide film 25 has a thickness of 500 nm, the inductance L, resistance R and capacitance C thereof are L=1.4 nH, R=1.2$\Omega$ and C=2 pF.

Figure 16:
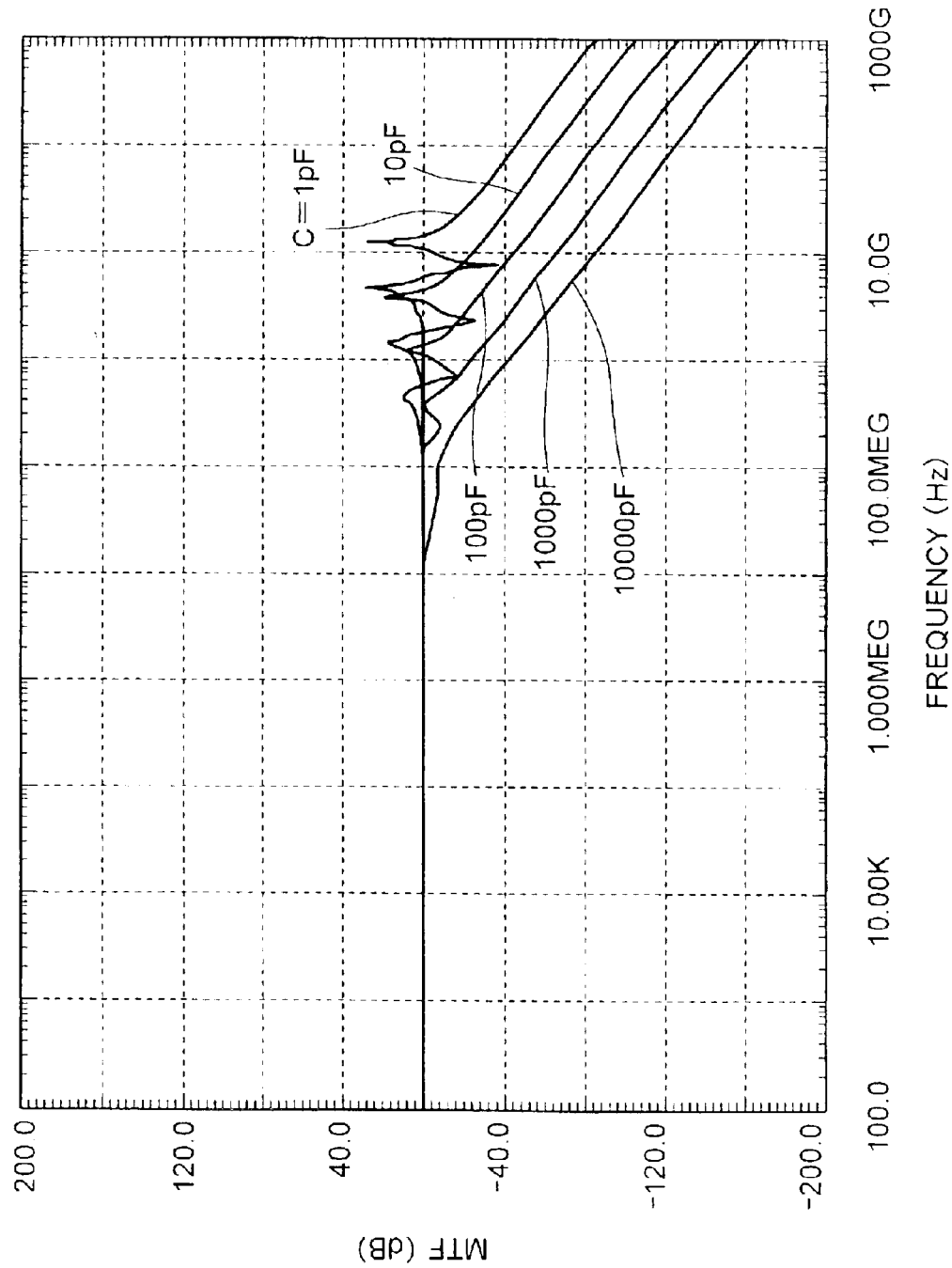
FIG. 16 is a graph showing relationships between the modulation transfer function and the noise frequency.

Referring to FIG. 16, the modulation transfer function (MTF: dB) of the interconnect line is plotted on ordinate against the frequency (Hz) plotted on abscissa, with C being a parameter and L and R being fixed. Here, the interconnect line is approximated by a ladder line while dividing the interconnect line into ten pieces. As shown in FIG. 16, the degree of the transmission of the electromagnetic wave in the higher-frequency range decreases with the increase of the line capacitance, thereby showing the improvement in the decoupling performance.

The performance required of the decoupling device in a current higher-speed semiconductor circuit is such that the MTF assumes –26 dB or below, and preferably –30 dB or below, and more preferably –40 dB or below in the frequency range between 10 and 100 GHz. In other words, FIG. 16 shows that a preferable decoupling performance is obtained by achieving 100 pF or more for the capacitance of the line device.

Since the capacitance of the line device 17 should be set depending on the required decoupling performance, as described above, it is preferable to form the line device 17, the switching device 19 and the power-source distribution line on a single semiconductor substrate to achieve an on-chip semiconductor circuit. In addition, these devices should be preferably formed by using a common semiconductor process. This assures the capacitance of the line device 17 to be set above the value which is needed for decoupling the high-frequency noise generated on the distribution line by the switching device 19.

In addition, the line device 17 and the switching device 19 should be disposed in close proximity to each other to thereby reduce the leakage of the electromagnetic wave at a higher frequency range. Moreover, the close proximity of the line device 17 and the switching device 19 reduces the area occupied by these devices 17 and 19 on the semiconductor substrate, thereby achieving a higher-density integration.

The techniques for achieving a higher capacitance for the line device 17 will be described hereinafter, with reference to accompanying drawings, wherein similar constituent elements are designated by similar reference numerals.

First Embodiment

Figure 1A:
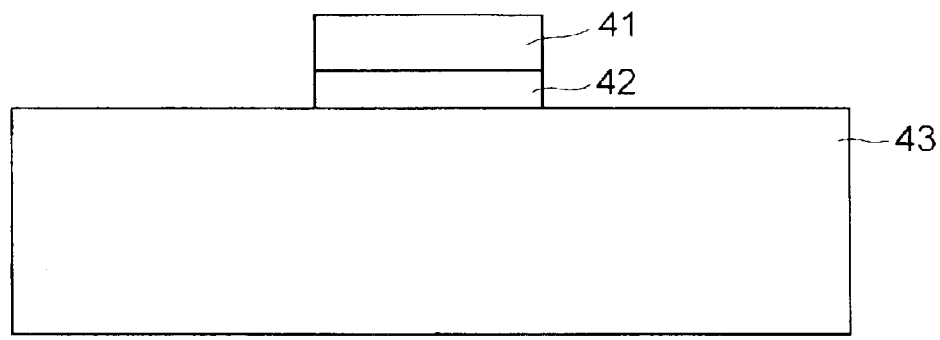
FIGS. 1A and 1B are sectional view and perspective view, respectively, of a decoupling device (line device) in a semiconductor circuit according to a first embodiment of the present invention.
Figure 1B:
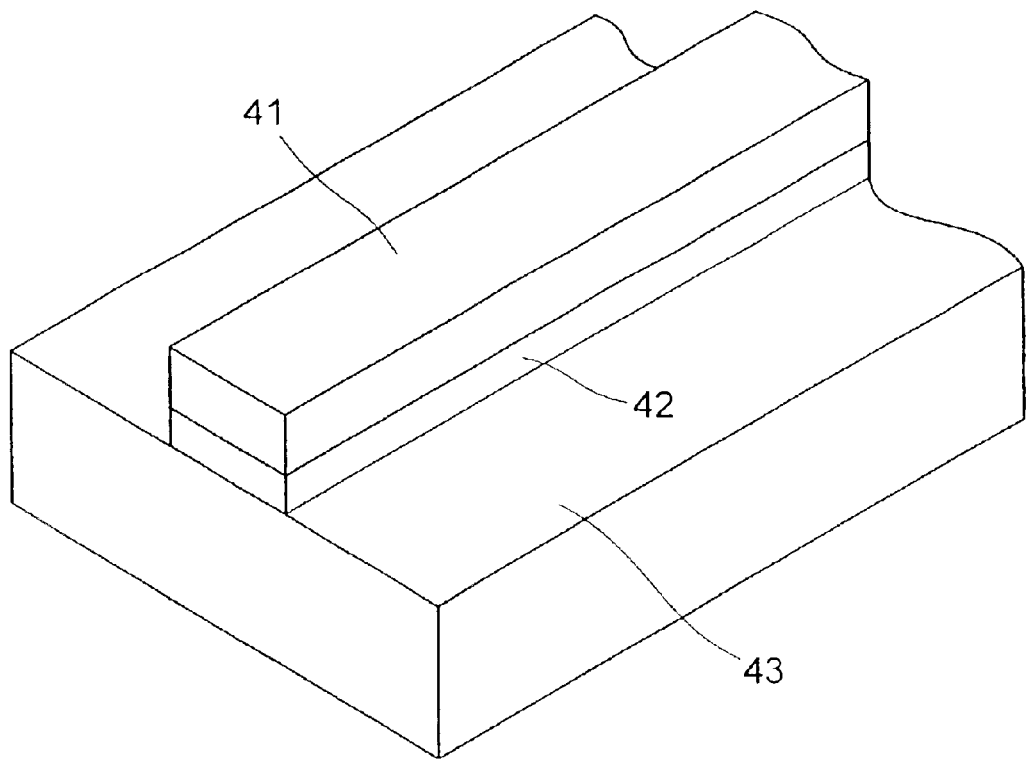

Referring to FIGS. 1A and 1B, there is shown a structure of a line device according to a first embodiment of the present invention. An interconnect line 41 of the line device is formed on a p-type or n-type semiconductor substrate 43 with an intervention of an insulator film 42. The interconnect line 41 forms a part of a power-source distribution line (referred to as simply distribution line hereinafter) which supplies power to the switching device.

The semiconductor substrate 43 may be made of any of known semiconductor materials, and may be preferably silicon in view of the feasibility of the fabrication procedure. Examples of the material for the insulator film 42 include $SiO_2$, SiO, SiN, $TaO_2$, $TiO_2$, $Al_2O_3$, MgO, $SrTiO_3$, $ZrO_2$ and $LaAlO_3$, but are not limited thereto. Each of these insulators may be used alone or in combination with one or more of other recited insulators. These oxide films have excellent conformity with the silicon semiconductor process, and thus suited as the materials for the insulator film 42. Examples of the material for the interconnect line 41 include metals such as polysilicon, aluminum (Al), Al alloy, and copper, but are not limited thereto.

The line capacitance, i.e., the capacitance between the interconnect line 41 and the semiconductor substrate 43, which should be 100 pF or above for achieving an excellent decoupling performance in the frequency range between 10 and 100 GHz, is obtained by selecting 10 nm or below for the thickness of the insulator film 42 in the case wherein the interconnect line 41 has a length of 2 mm and a width of 50 $\mu$m, with the insulator layer 42 being made of $SiO_2$.

If the insulator film 42 is made of SiO, SiN, $TaO_2$, $TiO_2$, $Al_2O_3$ or MgO having a relative permittivity (dielectric constant) of "8" which is twice the relative permittivity of $SiO_2$, a thickness of 20 nm or below may be selected for achieving a line capacitance of 100 pF. Similarly, if the insulator film 42 is made of $SrTiO_3$ or $ZrO_2$ having a relative permittivity of "16" which is quadruple the relative permittivity of $SiO_2$, a thickness of 40 nm or below may be selected for the insulator film 42 for achieving a capacitance of 100 pF. Similarly, if the insulator film 42 is made of $LaAlO_3$ etc. having a relative permittivity of "24" which is sixfold the relative permittivity of $SiO_2$, a thickness of 60 nm or below may be selected for the insulator film 42 for achieving a capacitance of 100 pF.

Figure 2:
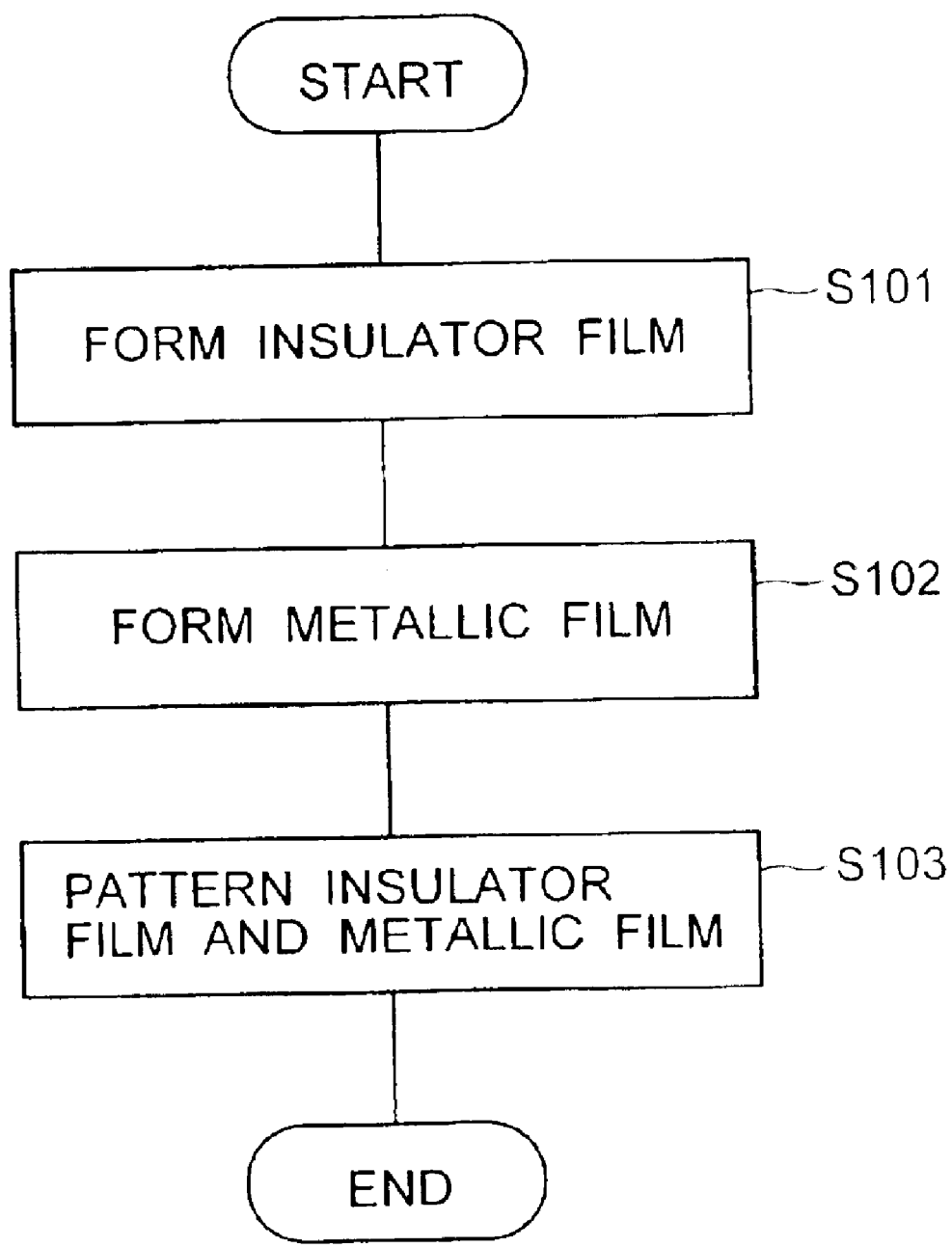
FIG. 2 is a flowchart of a process for manufacturing the line device of the first embodiment.

Referring to FIG. 2, a method for manufacturing the line structure of FIG. 1 includes the step of forming a insulator film 42 on a semiconductor substrate 43 by a CVD process (step S101), wherein the thickness of the insulator film 42 is selected at a value for achieving a line capacitance of 100 pF for the interconnect line 41.

Subsequently, a metal such as Al is deposited on the insulator film 42 overlying the semiconductor substrate 41 by an evaporation technique (step S102), followed by patterning thereof by using a photolithographic technique to form the interconnect line 41, removing exposed portions from the resultant wafer by using a wet etching technique, and washing the photoresist off the wafer (step S103), whereby the structure of FIG. 1 is obtained.

The thus manufactured line device has an excellent decoupling performance in a digital circuit generating therein high-frequency noise as high as between 10 and 100 GHz.

Second Embodiment

Figure 3A:
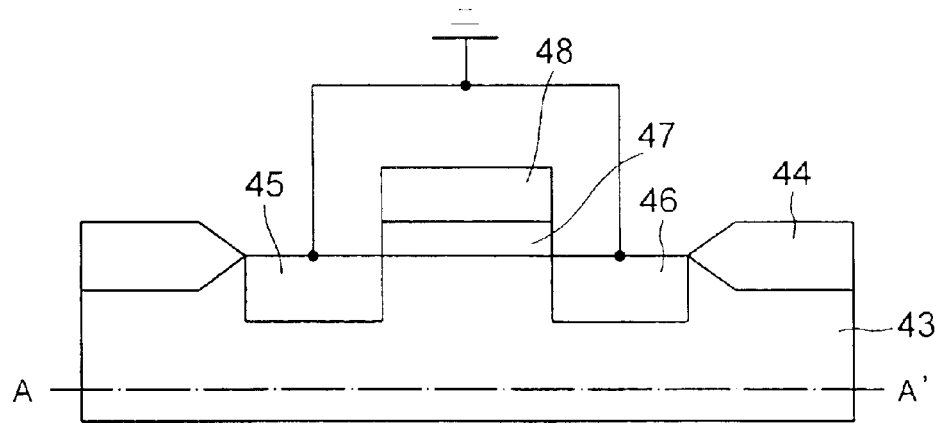
Figure 3B:
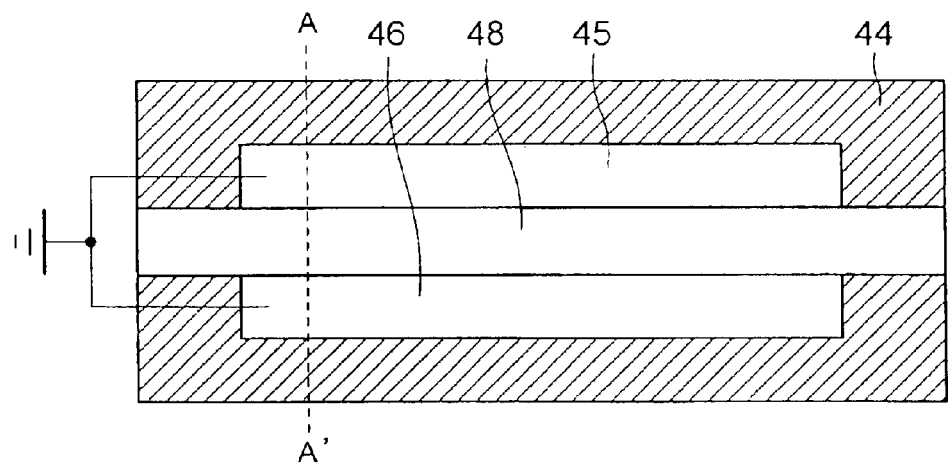
Figure 3C:
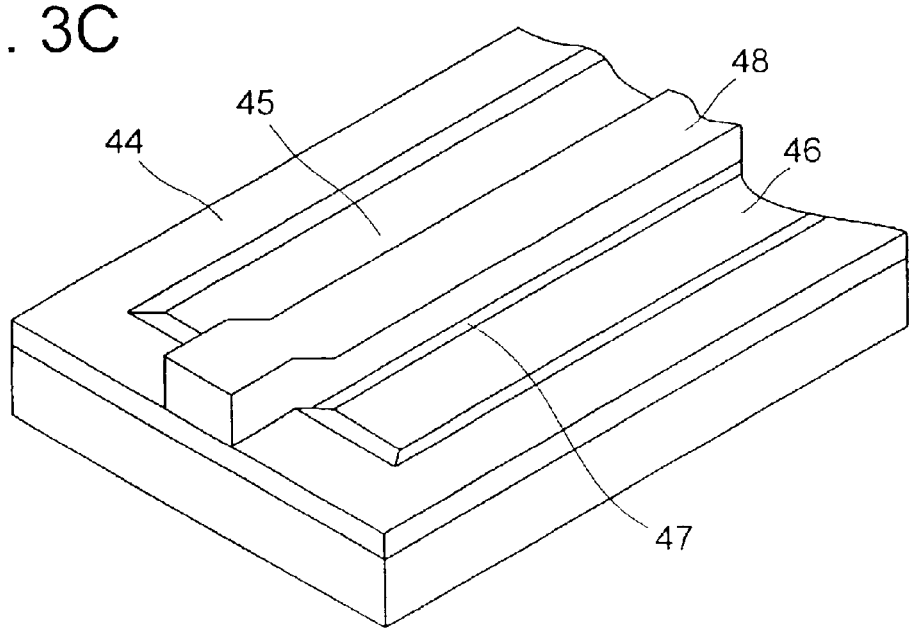

Next, a second embodiment will be described with reference to FIGS. 3A to 3C, wherein an insulator film such as used as a gate oxide film in a general semiconductor circuit is used in the line device to underlie the interconnect line.

The line device shown in these drawings has a structure similar to a MOSFET, including a portion of a semiconductor (silicon) substrate 43 receiving therein diffused regions 45 and 46, an oxide film 47 formed on the semiconductor substrate 43 between the diffused regions 45 and 46 as viewed from above, and an interconnect line 48 formed on the oxide film 47. The interconnect line 48 forms a part of the distribution line to supply power source voltage.

The diffused regions 45 and 46 are received in a region encircled by a field oxide film 44, which isolates the region from other regions. The diffused regions 45 and 46 are maintained at the ground potential. The diffused regions 45 and 46 may have a conductivity type same as or opposite to the conductivity type of the semiconductor substrate 43. For example, if the semiconductor substrate is of n-type, the diffused regions may be of $n^+$-type or $p^+$-type. Same applies to the case of a p-type substrate.

It is assumed that the semiconductor substrate 43 is of p-type, and the diffused regions 45 and 46 are of $n^+$-type. This structure is similar to a MOSFET. In other words, the line structure is implemented by using the structure of MOSFET, wherein diffused regions 45 and 46 correspond to source and drain, respectively, the insulator film 47 corresponds to a gate oxide film, and the interconnect line 48 corresponds to a gate electrode.

Examples of the material for the insulator film 47 include $SiO_2$, SiO, SiN, $TaO_2$, $TiO_2$, $Al_2O_3$, MgO, $SrTiO_3$, $ZrO_2$ and $LaAlO_3$, each of which may be used alone or in combination with one or more of other materials. These materials have excellent conformity with the silicon semiconductor process. Examples of the material for the interconnect line 48 include polysilicon, Al, Al alloy, and Cu. The diffused regions 45 and 46 are obtained by heavily doping the semiconductor substrate with impurities such as arsenic, phosphorus and boron. The material for the semiconductor substrate 43 is similar to that used in the first embodiment.

In the present embodiment, for achieving a line capacitance of 100 pF by which an excellent decoupling performance is obtained in the frequency range between 10 and 100 GHz, the interconnect line 48 has a length of 2 mm and a width of 50 μm, the insulator film 47 has a thickness of 10 nm or below for the case of $SiO_2$, for example. A field oxide film in general has a thickness around 500 to 1000 nm and hardly affords a line capacitance of 100 pF or above.

The insulator film 47 having such a small thickness is obtained by using the structure of the gate oxide film, and the line structure of the present embodiment can be formed by using the same steps for forming MOSFETs. This simplifies the fabrication process for the semiconductor circuit.

Figure 4:
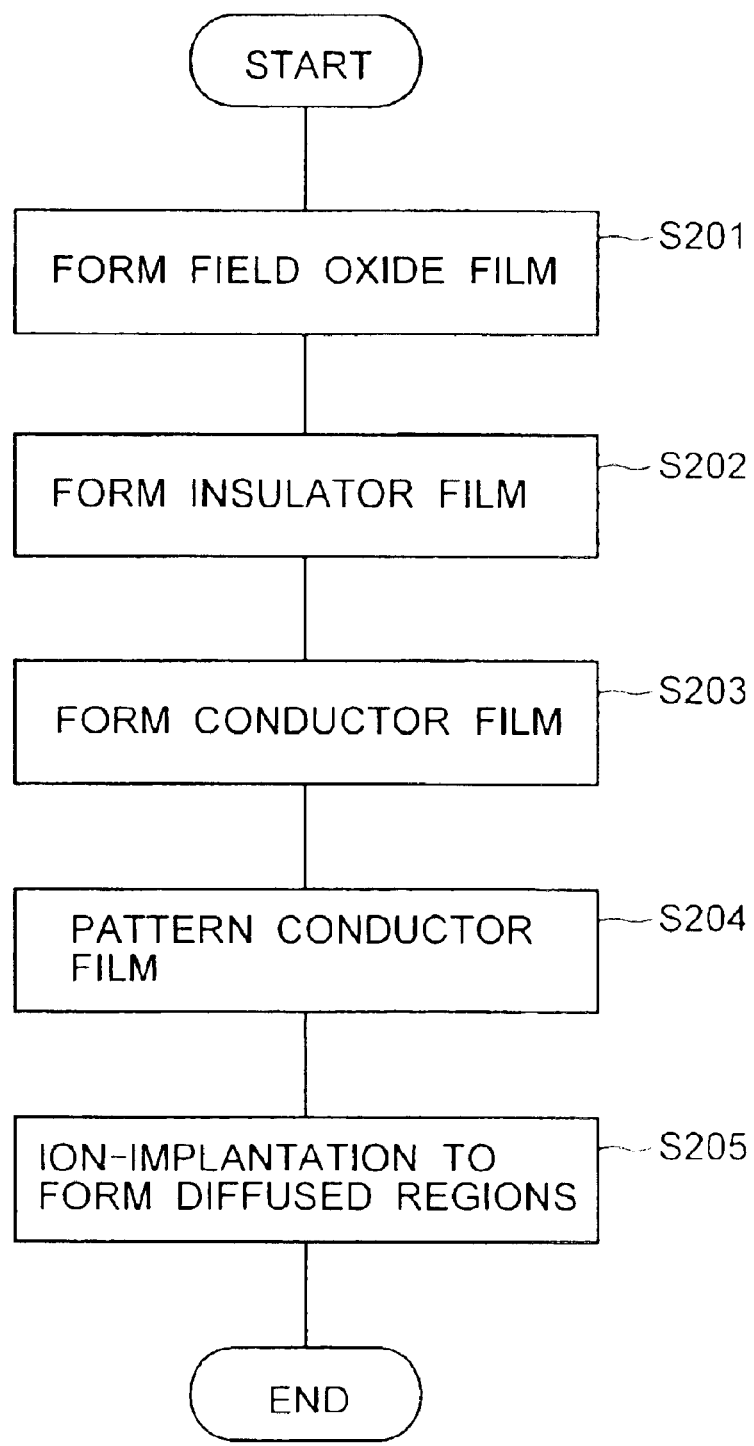
FIG. 4 is a flowchart of a process for manufacturing the line device of the second embodiment.

Referring to FIG. 4, a process for manufacturing a semiconductor circuit having the line device of the present embodiment includes the step (S201) of forming a field oxide film 44 for isolating MOS areas on a semiconductor substrate 43, by oxidizing the surface area of the semiconductor substrate 43 of a p-type silicon, for example. Subsequently, an insulator film is formed as a gate oxide film on the silicon surface (step S202), followed by forming a conductor film, e.g., a polysilicon film thereon by using a low-pressure CVD technique (step S203). Thereafter, a photoresist mask is formed on the polysilicon film, and used as an etching mask to pattern the polysilicon film and the insulator film to obtain the interconnect line 48 and the insulator film 47 (step S204). Ion-implantation is then conducted for introducing impurities in the areas encircled by the field oxide film 44 adjacent to the interconnect line 48, thereby forming diffused regions having a $n^+$-type conductivity in the p-type substrate 43 (step S205). Thus, the line device including a portion of the substrate 43, insulator film 47 and the interconnect line 48 is obtained.

When a voltage is applied to the interconnect line 48, the substrate potential in fact fluctuates by the influence of the interconnect line 48. However, the potential fluctuation of the semiconductor substrate 43 can be alleviated in the above embodiment by the diffused regions 45 and 46 disposed near both sides of the interconnect line 48 and maintained at the ground potential.

As a specific example, wherein silicon substrate 43, field oxide film 44 and $SiO_2$ insulator film 47 are used in the present embodiment, a line capacitance of 100 pF can be obtained by selecting the length, width and thickness of the interconnect line 48 at 2 mm, 50 μm and 100 nm, respectively, and the thickness of the insulator film 47 at 10 nm or less.

Figure 5A:
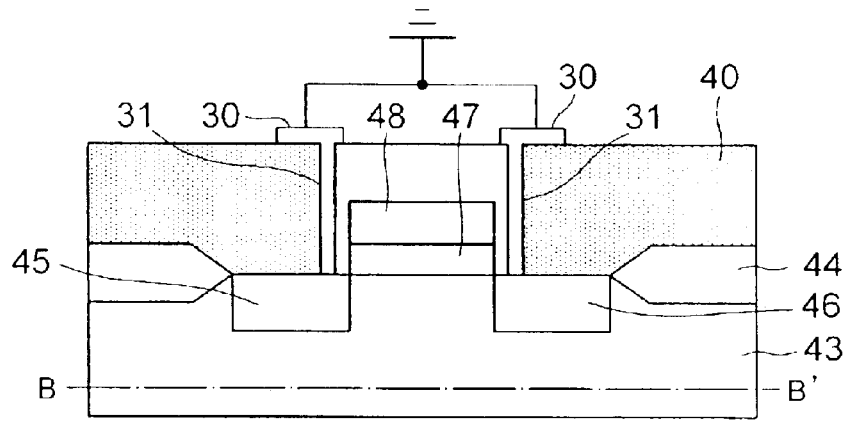
Figure 5B:
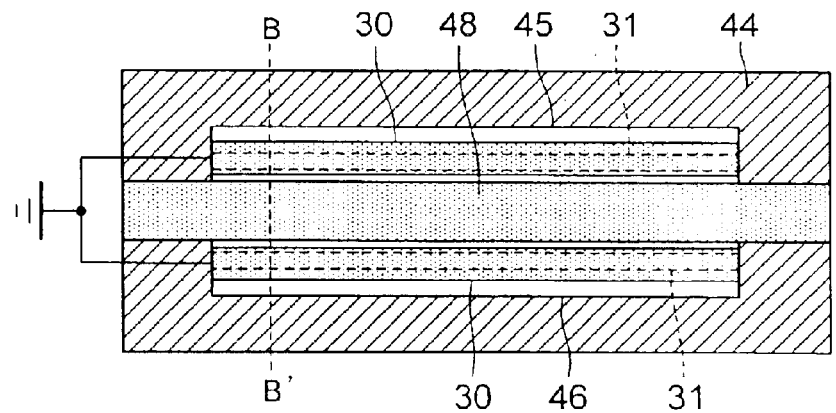
Figure 5C:
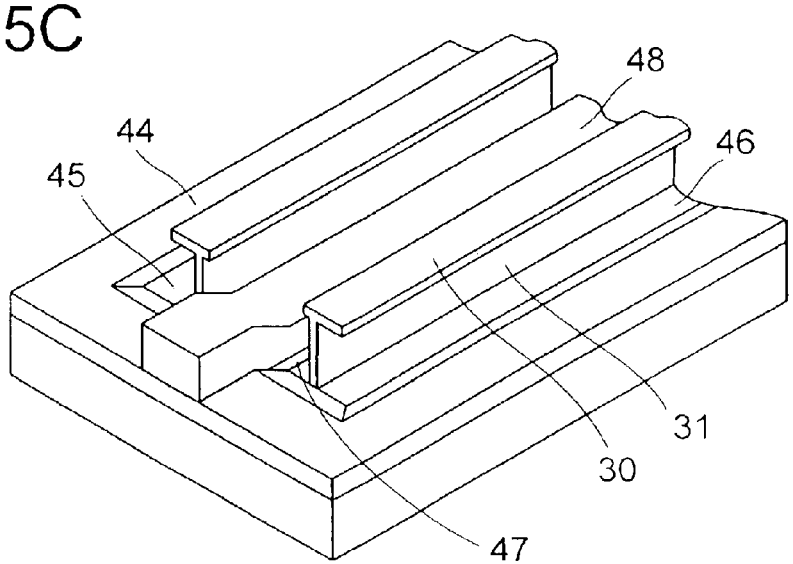

FIGS. 5A, 5B and 5C show a modification of the second embodiment. The modification is similar to the embodiment shown in FIGS. 3A, 3B and 3C except that each of the diffused regions 45 and 46 is connected to a ground line 30 through a contact plug 31 which is formed to penetrate a protective film 40 covering the line device, in this modification. For a better understanding, the protective film 40 is depicted in FIG. 5A, and omitted for depiction in FIGS. 5B and 5C.

The contact plug 31, as viewed from above, is of a stripe having a width extending along the extending direction of the insulator film 47 and disposed in a spaced relationship therewith and yet in close proximity to the interconnect line 48. That is, the contact plug 31 is substantially a conductor stripe for the case of a straight interconnect line 48, and may be made of Al, Al alloy or copper.

Although the thickness of the interconnect line 48 is smaller compared to the width thereof, the capacitance of the interconnect line 48 may be increased by about several percents by the contact plug 31 opposing the side surface of the interconnect line 48. This configuration improves the decoupling performance of the line device, which effectively blocks transmission of high-frequency noise of 10 to 100 GHz in a digital circuit.

Third Embodiment

Figure 6A:
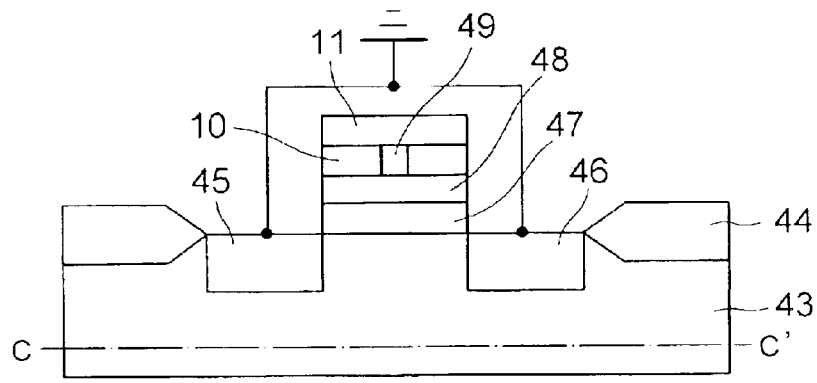
Figure 6B:
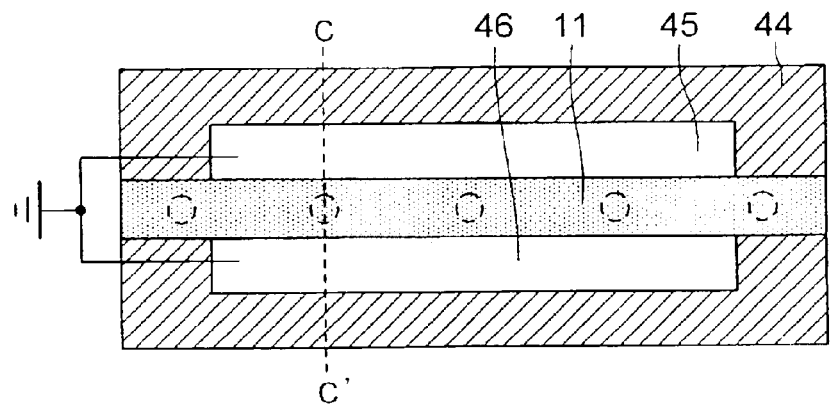
Figure 6C:
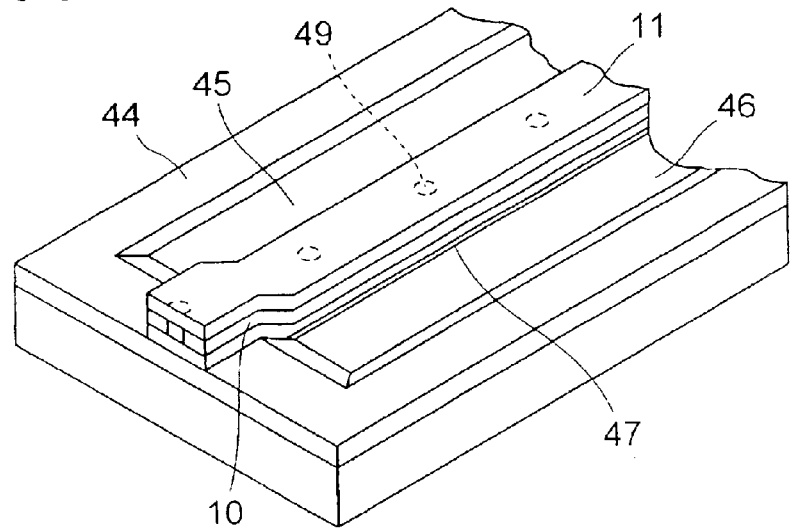

Referring to FIGS. 6A, 6B and 6C, there is shown a line device according to a third embodiment of the present invention, which is similar to the second embodiment except that the resistance of the interconnect line 48 having a structure of a gate electrode line is reduced by forming a bypass line or associated interconnect line.

More specifically, the interconnect line 48 is associated with a metallic interconnect line 11 formed on an interlevel dielectric film 10 overlying the interconnect line 48. The associated interconnect line 11 has a width similar to the width of the interconnect line 48 and extends parallel thereto. The associated interconnect line 11 is connected to the interconnect line 48 via contact plugs 49 penetrating the interlevel dielectric film 10 and arranged along the interconnect line 48. In this embodiment, the interconnect line 48, contact plugs 49 and the associated interconnect line 11 form a part of the distribution line, which supplies power source to the switching device or noise source. Accordingly, a portion of the semiconductor substrate 43, insulator film 47, interconnect line 48, interlevel dielectric film 10 and associated interconnect line 11 in combination constitute the line device Materials for the constituent elements may be selected from those recited in the preceding embodiments.

It is considered in the present embodiment that the polysilicon gate electrode line doped with impurities generally has an insufficient conductivity and thus an insufficient performance as a distribution line. The associated interconnect line may be made of Al, Al alloy or Cu.

Figure 7:
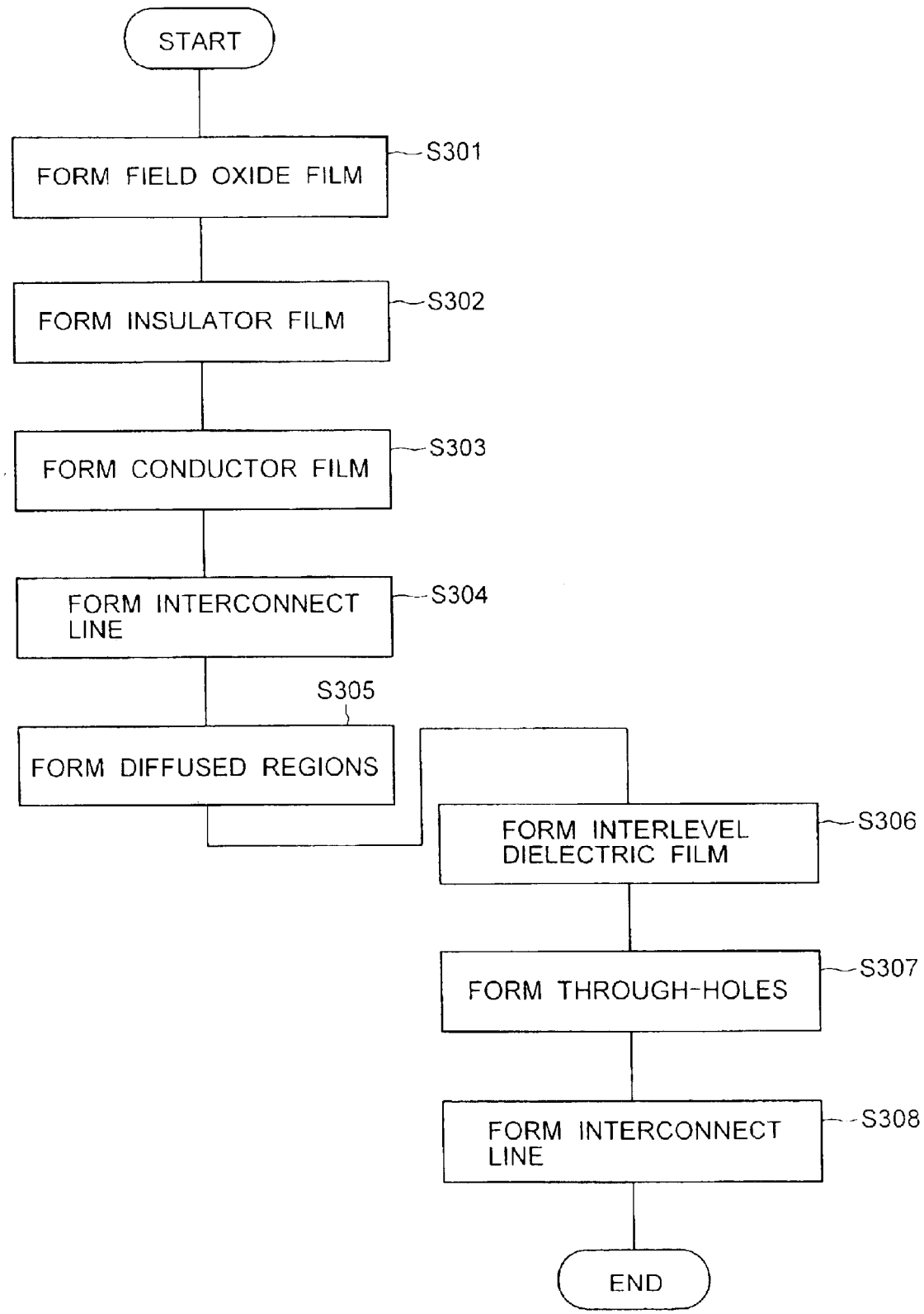
FIG. 7 is a flowchart of a process for manufacturing the line device of the third embodiment.

Referring to FIG. 7, a process for manufacturing the line device of FIGS. 6A, 6B and 6C includes steps S301 to S305, which are similar to steps S201 to S205, respectively, shown in FIG. 4, and additional steps S306 to S308. More specifically, After the interconnect line 48 is formed in step S305, the interlevel dielectric film 10 is formed (step S306), followed by patterning thereof to form through-holes therein (step S307). Thereafter, Al is deposited on the interlevel dielectric film 10 and within the through-holes, followed by patterning thereof by using a selective etching technique to form the associate interconnect line 11 and contact plugs 49 (step S308).

As a specific example, wherein the materials for the semiconductor substrate 43, field oxide film 44, interlevel dielectric film 10, interconnect line 48 and associated interconnect line 11 are silicon, $SiO_2$, $SiO_2$, polysilicon and Al, respectively, a line capacitance of 100 pF between the interconnect line 48 and the semiconductor substrate 43 can be obtained by selecting the length, width and thickness of the interconnect line 48 at 2 mm, 50 µm and 300 nm, respectively, the thickness of the interlevel dielectric film 10 at 200 nm, the thickness of the associated interconnect line 11 at 1000 nm, and the thickness of the insulator film 47 at 10 nm or less.

In the present embodiment, the interlevel dielectric film. 10 may be omitted to obtain a layered interconnect line. In this case, a barrier metal film may be preferably interposed between the interconnect line 48 and the associated interconnect line 11. The present embodiment also achieves improvement in the decoupling performance similarly to the preceding embodiments.

Fourth Embodiment

Figure 8A:
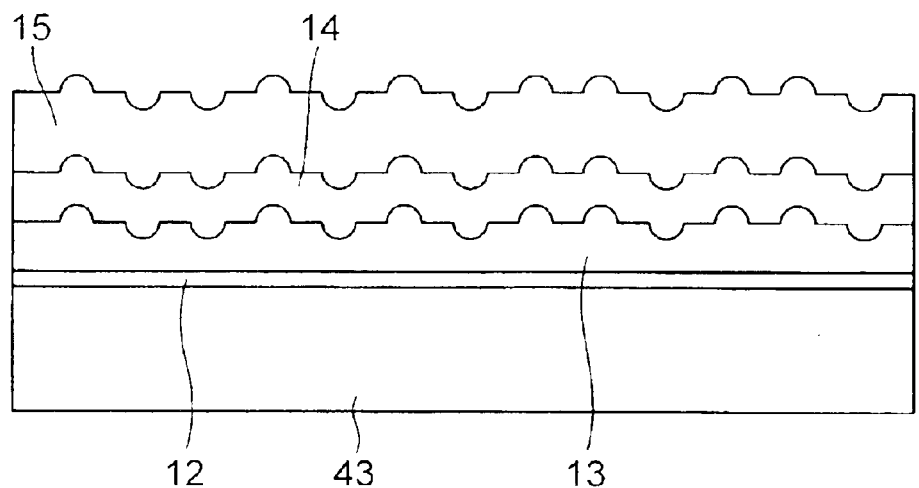
FIGS. 8A and 8B are sectional views of examples of a line device in a semiconductor circuit according to a fourth embodiment of the present invention.
Figure 8B:
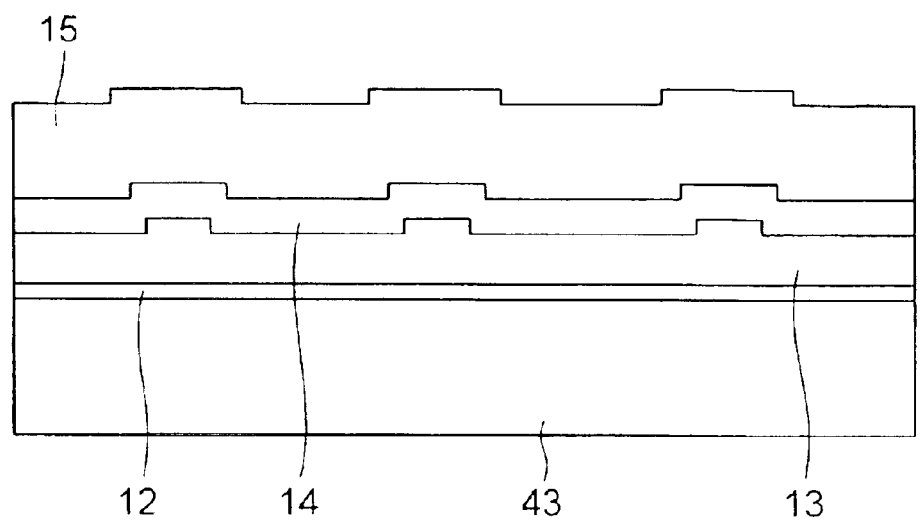

Referring to FIGS. 8A and 8B, there are shown examples of a fourth embodiment of the present invention, wherein the interconnect line of the line device has a convex and concave surface thereon.

The line device shown in FIG. 8A includes a portion of the semiconductor substrate 43, and insulator film 12, conductor film 13, insulator film 14 and interconnect line 15, which are consecutively formed on the portion of the semiconductor substrate 43. The interconnect line 15 forms a part of the distribution line which supplies power source to the switching device. In the present embodiment, the line structure includes the interconnect line 15, insulator film 14, and conductor layer 13 provided as a ground layer.

Materials used for forming these elements are similar to those described in the preceding embodiments. However, the conductor layer 13 may be preferably made of polysilicon, for example, because it is easy to form thereon convexities and concavities. Overlying insulator film 14 and the interconnect line 15 also have convexities and concavities at the interface therebetween corresponding to the convexities and the concavities formed on the conductor layer 13. The convexities and the concavities increase the area at which both the interconnect line 15 and the ground layer (conductor layer) 13 oppose each other, thereby increasing the line capacitance.

Figure 9:
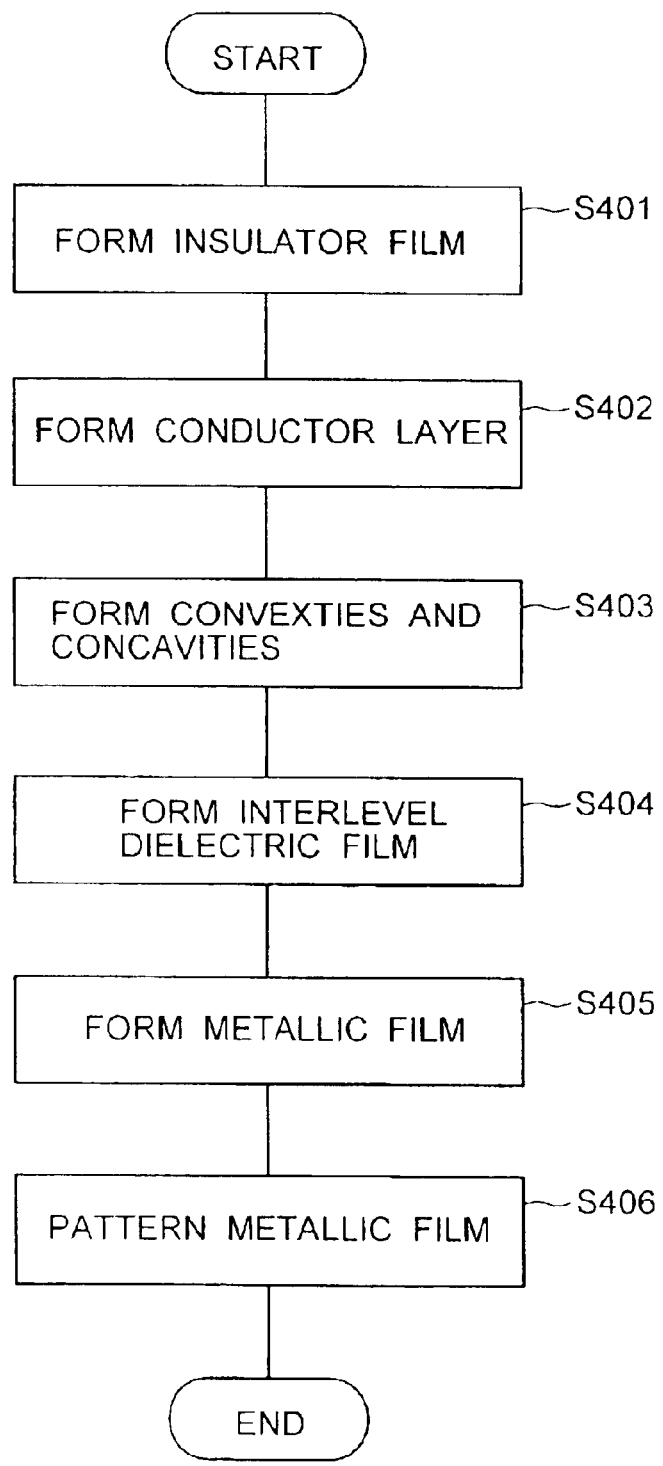
FIG. 9 is a flowchart of a process for manufacturing the line device of FIG. 8A.

Referring to FIG. 9, there is shown a process for manufacturing the structure of FIG. 8A. An insulator film 12 is formed on the semiconductor substrate 43 by using a CVD technique, for example (step S401). Polysilicon is then deposited on the insulator film 12 to form the conductor layer 13, followed by forming convexities and concavities on the surface of the conductor layer 13 by spraying an etchant on the polysilicon surface (step S403). In an alternative, the convexities and concavities may be formed on the polysilicon layer 13 by introducing $SiH_4$ gas onto the polysilicon layer 13 received in a chamber.

The insulator film 14 is then deposited on the convex and concave surface of the conductor layer 13 (step S404). The thickness of the insulator film 14 is controlled so that 100 pF is obtained for the line capacitance between the interconnect line 15 and the conductor layer 13. Metal such as Al is then deposited on the insulator film 14 to form a metallic film, followed by forming a photoresist mask and patterning the metallic film by wet etching using the photoresist mask as an etching mask to configure the interconnect line 15.

Figure 10:
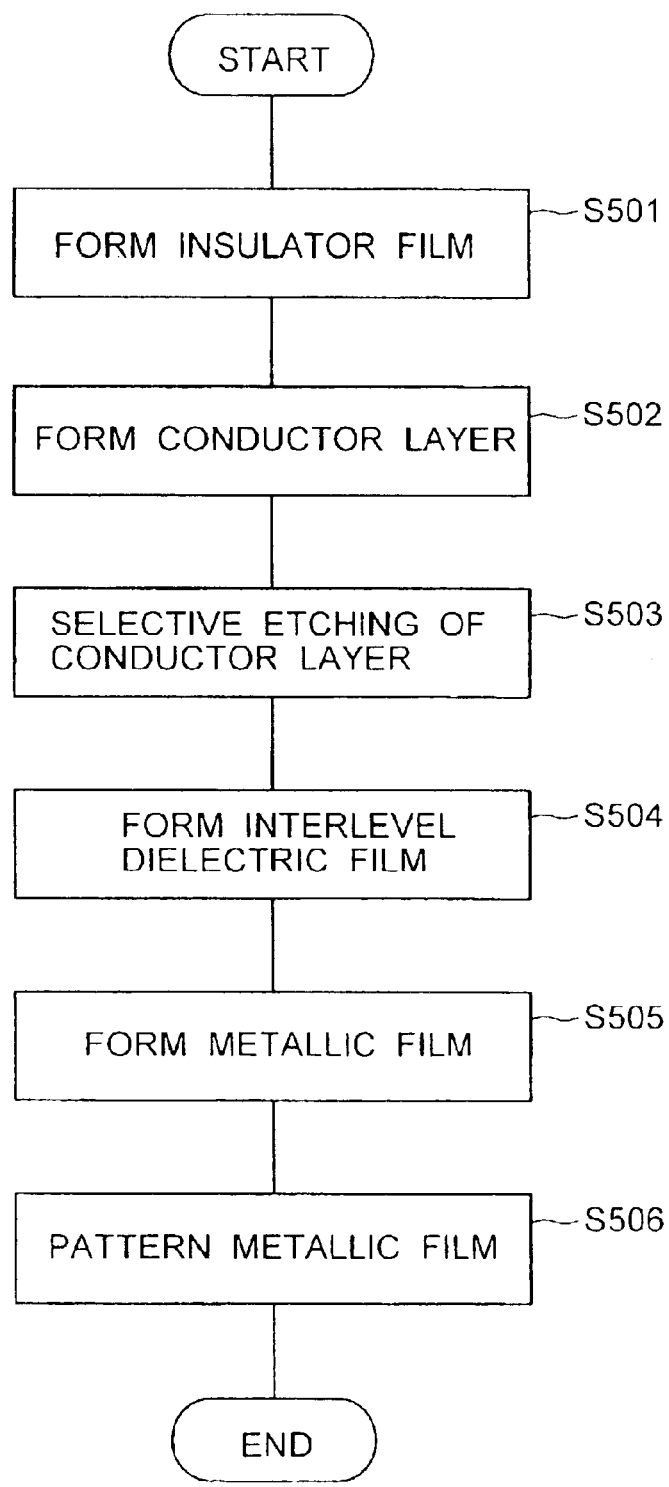
FIG. 10 is another flowchart of a process for manufacturing the line device of FIG. 8B.

In FIG. 8B, an alternative structure of the present embodiment has stepped convexities and concavities on the conductor layer 13. FIG. 10 shows a process for manufacturing the structure of FIG. 8B, including steps S501 to S506 which are similar to steps S401 to S406 shown in FIG. 9 except for step S503. Step S503 is such that the surface of the polysilicon layer 13 is selectively etched by using a photoresist mask as an etching mask.

As a specific example, wherein the materials for the semiconductor substrate 43, insulator film 12, insulator film 14, conductor layer 13 and interconnect line 15 are silicon, $SiO_2$, $SiO_2$, polysilicon and Al, respectively, a line capacitance of 100 pF or above can be obtained between the interconnect line 15 and the conductor layer 13 by selecting the length, width and thickness of the interconnect line 15 at 2 mm, 50 µm and 1000 nm, respectively, the thickness of the conductor layer 13 at 500 nm, and the thickness of the insulator film at 10 nm or less, and by forming ten depressions each having a width of 2.5 µm and a depth of 250 nm on the polysilicon layer 13.

The line device of the present embodiment has an excellent decoupling performance for decoupling high-frequency noise in the frequency range between 10 GHz and 100 GHz, for example, in a digital circuit.

Since the above embodiments are described only for examples, the present invention is not limited to the above embodiments and various modifications or alterations can be easily made therefrom by those skilled in the art without departing from the scope of the present invention. For example, the frequency range between 10 GHz and 100 GHz is only an example, and the line device of the present invention can be applied to other frequency ranges by selecting different values for the parameters of the constituent elements. In addition, although a silicon process is used in the above embodiments, other processes such as a GaAs process may be used in the present invention.

What is claimed is:

1. A decoupling device formed in a semiconductor circuit, comprising:

a semiconductor substrate;

an insulator film formed on said semiconductor substrate; and an interconnect line formed on said insulator film, wherein:

a line capacitance between said interconnect line and said semiconductor substrate is set at a value such that said decoupling device effectively decouples an electromagnetic noise wave generated in said semiconductor circuit.

wherein said line capacitance is 100 pF or above and said electromagnetic noise wave has a frequency between 10 GHz and 100 GHz.

2. The decoupling device according to claim 1, wherein said interconnect line decouples said electromagnetic noise wave at a transmission factor of −40 dB or below.

3. A decoupling device formed in a semiconductor circuit, comprising:
- a semiconductor substrate;
- an insulator film formed on said semiconductor substrate; and
- an interconnect line formed on said insulator film, wherein:
- a line capacitance between said interconnect line and said semiconductor substrate is set at a value such that said decoupling device effectively decouples an electromagnetic noise wave generated in said semiconductor circuit,
- wherein said insulator film is of a stripe, and said semiconductor substrate includes thereon a pair of diffused regions sandwiching therebetween said stripe insulator film as viewed from above.

4. The decoupling device according to claim 3, wherein each of said diffused regions is connected to the ground via a conductor element.

5. The decoupling device according to claim 4, wherein said conductor element is of a stripe extending adjacent to and along said interconnect line.

6. The decoupling device according to claim 3, wherein said interconnect line decouples said electromagnetic noise wave at a transmission coefficient of −40 dB or below.

7. The decoupling device according to claim 3, wherein said line capacitance is 100 pF or above and said noise wave has a frequency between 10 GHz and 100 GHz.

8. The decoupling device according to claim 3, further comprising another interconnect line connected to said interconnect line and extending parallel to said interconnect line.

9. The decoupling device according to claim 8, wherein another insulator film is interposed between said interconnect line and said another interconnect line, and said another insulator film receives therein a contact plug connecting together said interconnect line and said another interconnect line.

10. The decoupling device according to claim 8, wherein said interconnect line and said another interconnect line form a layered interconnect line.

11. The decoupling device according to claim 3, wherein said diffused regions are encircled by a field oxide film, and said insulator film has a thickness smaller than a thickness of said field oxide film.

12. A decoupling device formed in a semiconductor circuit, comprising:
- a first insulator film formed on a semiconductor substrate;
- a conductor layer formed on said insulator film;
- a second insulator film formed on said conductor layer, and
- an interconnect line formed on said second insulator film, wherein:
- at least one of interfaces interface has a concave and a convex surface, said at least one interface being selected from rho group consisting of an interface between said conductor layer and said second insulator film and an interface between said second insulator film and said interconnect line has a concave and convex surface; and
- a line capacitance between said interconnect line and said conductor layer is set at a value such that said decoupling device effectively decouples an electromagnetic noise wave generated in said semiconductor circuit;
- wherein said line capacitance is 100 pF or above and said noise wave has a frequency between 10 GHz and 100 GHz.

13. The decoupling device according to claim 12, wherein said interconnect line decouples said electromagnetic noise wave at a transmission coefficient of −40 dB or below.

14. The decoupling device according to claim 12, wherein said insulator film is of stripe.

15. The decoupling device according to claim 12, wherein the decoupling device decouples said electromagnetic noise wave at a transmission coefficient of −40 dB or below.

16. A semiconductor circuit comprising:
- a semiconductor substrate;
- a high-frequency source overlying said semiconductor substrate;
- a power-source distribution line overlying said semiconductor substrate for supplying power to said high-frequency source; and
- a line device including a portion of said semiconductor substrate, an insulator flint formed on said portion, and an interconnect line formed on said insulator film, said interconnect line being connected in series with said power-source distribution line to thereby form a part thereof, wherein:
- a line capacitance between said interconnect line and said semiconductor substrate is set at a value such that said line device effectively decouples an electromagnetic wave generated by said high-frequency source;
- wherein said line capacitance is 100 pF or above and said electromagnetic noise wave has a frequency between 10 GHZ and 100 GHZ.

17. The semiconductor circuit according to claim 16, wherein said interconnect line decouples said electromagnetic noise wave at a transmission coefficient of −40 dB or below.

18. The semiconductor circuit according to claim 16, wherein said high-frequency source, power-source distribution line and line device are formed by a common semiconductor process.

19. A semiconductor circuit comprising:
- a semiconductor substrate;
- a high-frequency source overlying said semiconductor substrate;
- a power-source distribution line overlying said semiconductor substrate for supplying power to said high-frequency source; and
- a line device including a portion of said semiconductor substrate, an insulator film formed on said portion, and an interconnect line formed on said insulator film, said interconnect line being connected in series with said power-source distribution line to thereby form a part thereof, wherein:
- a line capacitance between said interconnect line and said semiconductor substrate is set at a value such that said line device effectively decouples an electromagnetic wave generated by said high-frequency source,
- wherein said insulator film is of a stripe, and said semiconductor substrate includes thereon a pair of diffused regions sandwiching therebetween said stripe insulator film as viewed from above.

20. The semiconductor circuit according to claim 19, wherein each of said diffused regions is connected to the ground via a conductor element.

21. The semiconductor circuit according to claim 19, wherein said conductor element is of a stripe extending adjacent to and along said interconnect line.

22. The semiconductor circuit according to claim 19, further comprising another interconnect line connected to said interconnect line and extending parallel to said interconnect line.

23. The semiconductor circuit according to claim 22, wherein another insulator film is interposed between said interconnect line and said another interconnect line, and said another insulator film receives therein a contact plug connecting together said interconnect line and said another interconnect line.

24. The semiconductor circuit according to claim 22, wherein said interconnect line and said another interconnect line form a layered interconnect line.

25. The semiconductor circuit according to claim 19, wherein said diffused regions are encircled by a field oxide film, and said insulator film has a thickness smaller than a thickness of said field oxide film.

26. The semiconductor circuit according to claim 19, wherein said insulator film and said interconnect line are formed during the steps of forming said high-frequency source.

27. A semiconductor circuit comprising:

a semiconductor substrate;

a high-frequency source overlying said semiconductor substrate;

a power-source distribution line overlying said semiconductor substrate for supplying power to said high-frequency source; and a line device including a conductor layer overlying said semiconductor substrate, an insulator film formed on said conductor layer, and an interconnect line formed on said insulator film, said interconnect line being connected in series with said power-source distribution line to thereby form a part thereof, wherein:

a line capacitance between said interconnect line and said conductor layer is set at a value such that said line device effectively decouples an electromagnetic wave generated by said high-frequency source;

wherein said line capacitance is 100 pF or above and said noise wave has a frequency between 10 GHz and 100 GHz.

28. The semiconductor circuit according to claim 27, wherein at least one of interfaces interface has a concave and a convex surface thereon, said at least one interface being selected from the group consisting of an interface between said conductor layer and said insulator film and an interface between said insulator film and said interconnect line has a convex and concave surface thereon.

29. The semiconductor circuit according to claim 27, wherein said line device decouples said electromagnetic noise wave at a transmission coefficient of −40 dB or below.

30. The semiconductor circuit according to claim 27, wherein said insulator film and said interconnect line are formed during the steps of forming said high-frequency source.

31. The semiconductor circuit according to claim 27, wherein said high-frequency source, power-source distribution line and line device are formed by a common semiconductor process.

* * * * *